United States Patent
Cheng et al.

(10) Patent No.: US 12,216,077 B2
(45) Date of Patent: Feb. 4, 2025

(54) BIOFET DEVICE HAVING A METAL CROWN STRUCTURE AS A SENSING LAYER DISPOSED ON AN OXIDE LAYER FORMED UNDER A CHANNEL REGION OF A TRANSISTOR

(71) Applicant: Taiwan Semiconductor Manufacturing Co., Ltd., Hsinchu (TW)

(72) Inventors: Chun-Wen Cheng, Zhubei (TW); Yi-Shao Liu, Zhubei (TW); Fei-Lung Lai, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/087,112

(22) Filed: Nov. 2, 2020

(65) Prior Publication Data
US 2021/0072181 A1 Mar. 11, 2021

Related U.S. Application Data

(60) Continuation of application No. 16/021,077, filed on Jun. 28, 2018, now Pat. No. 10,823,696, which is a (Continued)

(51) Int. Cl.
*H01L 29/78* (2006.01)
*G01N 27/414* (2006.01)
(Continued)

(52) U.S. Cl.
CPC ....... *G01N 27/4145* (2013.01); *H01L 23/345* (2013.01); *H01L 29/66477* (2013.01); *H01L 29/78* (2013.01); *H01L 21/84* (2013.01)

(58) Field of Classification Search
CPC .............. G01N 27/4145; H01L 23/345; H01L 29/66477; H01L 29/78
See application file for complete search history.

(56) References Cited

U.S. PATENT DOCUMENTS 4,020,830 A * 5/1977 Johnson ................ C12Q 1/001
204/414
5,702,981 A 12/1997 Maniar et al.
(Continued)

FOREIGN PATENT DOCUMENTS

| CN | 1987446 A | 6/2007 |
|---|---|---|
| CN | 102659752 A | 9/2012 |
| TW | 201224478 | 6/2012 |

OTHER PUBLICATIONS

Chung, Wen-Yaw et al., "A New Body-Effect Elimination Technique for ISFET Measurement," 2005 IEEE Sensors, Oct. 30, 2005-Nov. 3, 2005, pp. 1046-1049.

*Primary Examiner* — Anh D Mai
(74) *Attorney, Agent, or Firm* — Sterne, Kessler, Goldstein & Fox P.L.L.C.

(57) ABSTRACT

The present disclosure provides a bio-field effect transistor (BioFET) and a method of fabricating a BioFET device. The method includes forming a BioFET using one or more process steps compatible with or typical to a complementary metal-oxide-semiconductor (CMOS) process. The BioFET device includes a substrate, a transistor structure, an isolation layer, an interface layer in an opening of the isolation layer, and a metal crown structure over the interface layer. The interface layer and the metal crown structure are disposed on opposite side of the transistor from a gate structure.

20 Claims, 16 Drawing Sheets

Related U.S. Application Data division of application No. 13/969,160, filed on Aug. 16, 2013, now abandoned.

(60) Provisional application No. 61/782,534, filed on Mar. 14, 2013.

(51) Int. Cl.
 H01L 23/34 (2006.01)
 H01L 29/66 (2006.01)
 H01L 21/84 (2006.01)

(56) References Cited

U.S. PATENT DOCUMENTS

| | | | |
|---|---|---|---|
| 6,592,019 B2 | 7/2003 | Tung | |
| 7,060,510 B2 | 6/2006 | Bonnell et al. | |
| 7,087,475 B2 | 8/2006 | Inoh | |
| 7,211,459 B2 * | 5/2007 | Yang | G01N 27/414 |
| | | | 257/253 |
| 7,306,924 B2 | 12/2007 | Gomez et al. | |
| 7,361,946 B2 * | 4/2008 | Johnson | G01N 27/4148 |
| | | | 257/253 |
| 7,632,670 B2 | 12/2009 | Offenhausser et al. | |
| 7,695,609 B2 | 4/2010 | Soundarrajan et al. | |
| 7,696,530 B2 | 4/2010 | Yamamoto et al. | |
| 7,833,708 B2 | 11/2010 | Enzelberger et al. | |
| 7,854,827 B2 | 12/2010 | Curcio | |
| 7,923,314 B2 | 4/2011 | Tezuka et al. | |
| 8,007,727 B2 | 8/2011 | Shalev et al. | |
| 8,420,328 B2 | 4/2013 | Chen et al. | |
| 8,471,559 B2 | 6/2013 | Taherian et al. | |
| 8,519,490 B2 | 8/2013 | Bikumandla | |
| 8,557,643 B2 | 10/2013 | Han et al. | |
| 8,728,844 B1 | 5/2014 | Liu et al. | |
| 8,778,269 B2 | 7/2014 | Joshi et al. | |
| 8,871,549 B2 | 10/2014 | Ellis-Monaghan et al. | |
| 8,878,258 B2 | 11/2014 | Monfray et al. | |
| 8,900,905 B1 | 12/2014 | Liu et al. | |
| 9,080,969 B2 | 7/2015 | Liu et al. | |
| 9,389,199 B2 | 7/2016 | Cheng et al. | |
| 9,417,209 B2 | 8/2016 | Shen et al. | |
| 2002/0127623 A1 | 9/2002 | Minshull et al. | |
| 2004/0238379 A1 | 12/2004 | Lindsay et al. | |
| 2005/0097941 A1 | 5/2005 | Sandvik et al. | |
| 2005/0156207 A1 | 7/2005 | Yazawa et al. | |
| 2006/0035400 A1 | 2/2006 | Wu et al. | |
| 2006/0174692 A1 * | 8/2006 | Bonne | G01N 27/4141 |
| | | | 73/23.2 |
| 2006/0278528 A1 | 12/2006 | Fleischer et al. | |
| 2007/0045118 A1 | 3/2007 | Maruo et al. | |
| 2007/0120200 A1 | 5/2007 | Yun | |
| 2007/0295988 A1 | 12/2007 | Yamamoto et al. | |
| 2008/0053829 A1 | 3/2008 | Hayashida et al. | |
| 2009/0008629 A1 | 1/2009 | Matsumoto et al. | |
| 2009/0014757 A1 | 1/2009 | Takupalli et al. | |
| 2009/0095968 A1 | 4/2009 | Baek et al. | |
| 2011/0316565 A1 | 12/2011 | Guo et al. | |
| 2012/0032235 A1 | 2/2012 | Bikumandla | |
| 2012/0045368 A1 | 2/2012 | Hinz et al. | |
| 2013/0105868 A1 | 5/2013 | Kalnitsky et al. | |
| 2013/0200438 A1 | 8/2013 | Liu et al. | |
| 2014/0073039 A1 | 3/2014 | Chang et al. | |
| 2014/0106494 A1 * | 4/2014 | Bedell | H01L 21/84 |
| | | | 257/E21.409 |
| 2014/0256030 A1 | 9/2014 | Shen et al. | |
| 2014/0264467 A1 | 9/2014 | Cheng et al. | |
| 2014/0264468 A1 | 9/2014 | Cheng et al. | |
| 2014/0308752 A1 | 10/2014 | Cheng et al. | |
| 2018/0313783 A1 | 11/2018 | Cheng et al. | |

\* cited by examiner

BIOFET DEVICE HAVING A METAL CROWN STRUCTURE AS A SENSING LAYER DISPOSED ON AN OXIDE LAYER FORMED UNDER A CHANNEL REGION OF A TRANSISTOR

CROSS-REFERENCE TO RELATED APPLICATIONS AND INCORPORATION BY REFERENCE

This application is a continuation of U.S. application Ser. No. 16/021,077, filed Jun. 28, 2018, which is a divisional of U.S. application Ser. No. 13/969,160, filed Aug. 16, 2013, which claims priority to U.S. Provisional Patent Application No. 61/782,534, filed Mar. 14, 2013, the applications of which are incorporated herein by reference.

BACKGROUND OF THE INVENTION

Field of the Invention

This disclosure relates to biosensors and methods for forming bio-chips. Particularly, this disclosure relates to bio-chips having biosensors and fluidic devices and methods for forming them.

Background Art

Biosensors are devices for sensing and detecting biomolecules and operate on the basis of electronic, electrochemical, optical, and mechanical detection principles. Biosensors that include transistors are sensors that electrically sense charges, photons, and mechanical properties of bio-entities or biomolecules. The detection can be performed by detecting the bio-entities or biomolecules themselves, or through interaction and reaction between specified reactants and bio-entities/biomolecules. Such biosensors can be manufactured using semiconductor processes, can quickly convert electric signals, and can be easily applied to integrated circuits (ICs) and microelectromechanical systems (MEMS).

Biochips are essentially miniaturized laboratories that can perform hundreds or thousands of simultaneous biochemical reactions. Biochips can detect particular biomolecules, measure their properties, process the signal, and may even analyze the data directly. Biochips enable researchers to quickly screen large numbers of biological analytes for a variety of purposes, from disease diagnosis to detection of bioterrorism agents. Advanced biochips use a number of biosensors along with fluidic channels to integrate reaction, sensing and sample management. BioFETs (biological field-effect transistors, or bio-organic field-effect transistors) are a type of biosensor that includes a transistor for electrically sensing biomolecules or bio-entities. While BioFETs are advantageous in many respects, challenges in their fabrication and/or operation arise, for example, due to compatibility issues between the semiconductor fabrication processes, the biological applications, restrictions and/or limits on the semiconductor fabrication processes, integration of the electrical signals and biological applications, and/or other challenges arising from implementing a large scale integration (LSI) process.

BRIEF DESCRIPTION OF THE DRAWINGS/FIGURES

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
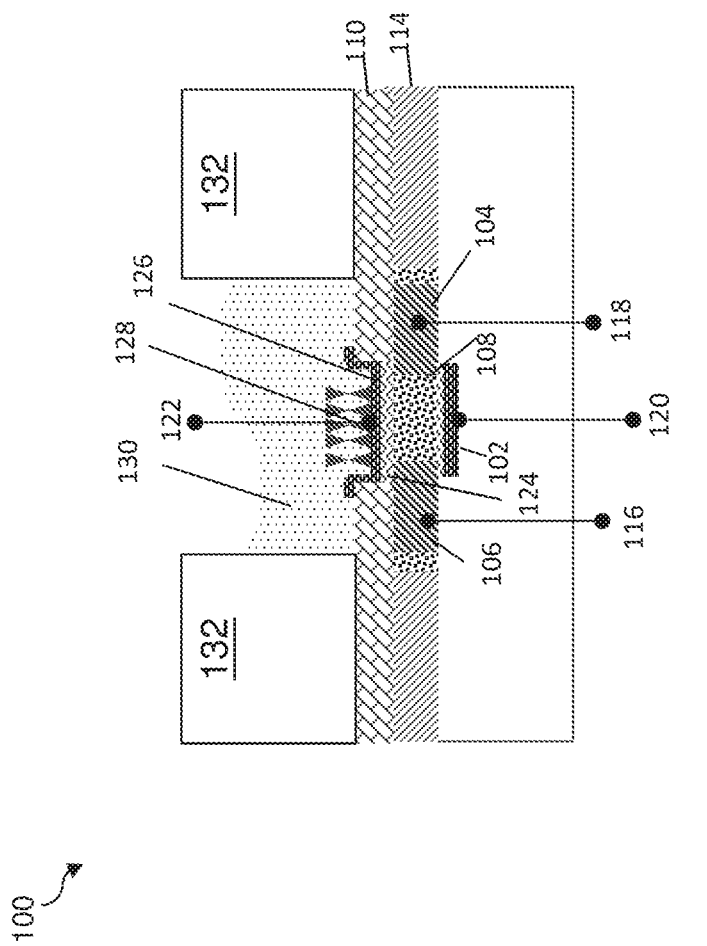
FIG. 1 is a cross-sectional view of an embodiment of a BioFET device according to one or more aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Further still, references to relative terms such as "top", "front", "bottom", and "back" are used to provide a relative relationship between elements and are not intended to imply any absolute direction. Various features may be arbitrarily drawn in different scales for simplicity and clarity.

In a BioFET, the gate of a MOSFET (metal-oxide-semiconductor field-effect transistor), which controls the conductance of the semiconductor between its source and drain contacts, is replaced by a bio- or biochemical-compatible layer or a biofunctionalized layer of immobilized probe molecules that act as surface receptors. Essentially, a BioFET is a field-effect biosensor with a semiconductor transducer. An advantage of BioFETs is the prospect of label-free operation. Use of BioFETs avoids costly and time-consuming labeling operations such tagging analytes with fluorescent or radioactive probes.

Binding of a target biomolecule or bio-entity to the gate or a receptor molecule immobilized on the gate of the BioFET modulates the conductance of the BioFET. When the target biomolecule or bio-entity is bonded to the gate or the immobilized receptor, the drain current of the BioFET is varied by the gate potential, which depends on the type and amount of target bound. This change in the drain current can be measured and used to determine the type and amount of bonding between the receptor and the target biomolecule or bio-entity. A variety of receptors may be used to functionalize the gate of the BioFET such as ions, enzymes, antibodies, ligands, receptors, peptides, oligonucleotides, cells of organs, organisms and pieces of tissue. For instance, to detect ssDNA (single-stranded deoxyribonucleic acid), the gate of the BioFET may be functionalized with immobilized complementary ssDNA strands. Also, to detect various proteins such as tumor markers, the gate of the BioFET may be functionalized with monoclonal antibodies.

One example of a biosensor has a sensing surface is a top of a floating gate connected to the gate of the BioFET. The floating gate is connected to the gate structure of the BioFET through a stack of metal interconnect lines and vias (or multi-layer interconnect, MLI). The various metal layers over the gate electrode can also contribute to damage by antenna effect during the MLI formation process. In such a BioFET, the potential-modulating reaction takes place at an outer surface of the final (top) metal layer or a dielectric surface formed on top of the MLI and is sensed indirectly by the BioFET. The sensitivity of the device is lower than other biosensors because of parasitic capacitances associated with the MLI. As result a sensing plate dimension is usually specified so that a sufficiently detectable amount of potential-modulating reaction can take place on the sensing plate. The minimum sensing plate dimension in turn limits the BioFET density.

In another example, the biomolecules bind directly or through receptors on the gate or the gate dielectric of the BioFET. These "direct sensing" BioFETs directly senses the target biomolecules without the parasitic capacitances associated with MLI. Its construction requires removal of the MLI material above the BioFET to form a sensing well that exposes the gate electrode or gate dielectric to the fluidic environment where potential-modulating surface reactions occur. These BioFETs are more sensitive than the floating gate types but are challenging to construct for several reasons. The sensing well etched has a high aspect ratio, for example, 30 or greater, so it is usually performed with high energy plasma etch. The high-aspect ratio of the sensing well also limits the profile of the etched sensing well. The high energy plasma etch can damage the gate electrode due to charge-induced damage. One attempt in reducing the aspect ratio of the sensing well to make the etch easier results in limitation of the number of metal layers, down to one or two metal layers. The reduction in metal layers limits the interconnect routing and integration options of the device, for example, the number and type of circuits for controlling the BioFET. The process is also very sensitive to alignment, because misalignment may expose the metals in the MLI surrounding sensing well or cause the sensing surface area to be smaller than designed.

In yet another example, the biomolecules are placed close to the gate from a backside of the substrate. In this example, a sensing surface is formed on the backside of the transistor gate through backside of the substrate. This example avoids the difficulty of having to etch through multiple layers of interconnects and yet places the biomolecules close enough to the gate to have much higher sensitivity than the floating gate biosensor. FIG. 1 is a schematic drawing of a backside sensing (BSS) BioFET 100. The semiconductor device 100 includes a gate structure 102 formed on substrate 114. The substrate 114 further includes a source region 104, a drain region 106, and an active region 108 (e.g., including a channel region) interposing the source region 104 and the drain region 106. The gate structure 102, the source region 104, the drain region 106, and the active region 108 may be formed using suitable CMOS process technology. The gate structure 102, the source region 104, the drain region 106, and the active region 108 form a FET. An isolation layer 110 is disposed on the opposing side of the substrate 114, as compared to the gate structure 102 (i.e., backside of the substrate).

An opening is provided in the isolation layer 110. The opening is substantially aligned with the active region 108. An interface layer 124 is disposed on the bottom of the opening on the surface of the active region 108.

According to various embodiments of the present disclosure, a metal crown structure 126 is disposed over the interface layer 124 and at least partially covering the sidewalls of the opening. The metal crown structure 126 is the sensing surface used to detect biomolecules or bio-entities. Area of the metal crown structure 126 is larger than the interface layer 124 and thus can accommodate more potential modulating reactions. In some embodiments, the metal crown structure 126 extends over the top corners of the opening and partially covers the isolation layer 110. In certain embodiments, a number of receptors are bound or amplified on the metal crown structure 126 to provide sites for detecting biomolecules or bio-entities. In other embodiments, the metal crown structure 126 surface is used to bind biomolecules or bio-entities having particular affinities to the metal material. The metal-containing material for metal crown structure 126 includes tantalum, tantalum nitride, niobium, tungsten nitride, ruthenium oxide, or combinations of these. Other metals including gold and platinum may also be used. According to some embodiments, the material for the metal crown structure 126 is an ohmic metal.

The semiconductor device also includes a fluidic structure 132 over the isolation layer 110 that forms a fluidic channel or well over the metal crown structure 126. During operation, a liquid analyte 130 is flowed into the fluidic channel. The liquid analyte 130 includes target molecules that would bind to the receptors 128 on the metal crown structure 126. The reaction and bound target molecules are sensed by the semiconductor device 100. The semiconductor device 100 includes electrical contacts, shown symbolically and not as a cross section of the actual contact, to the source region 106 (116), the drain region (118), the gate structure 102 (120), and/or the active region 108 (e.g., front gate (FG) 122).

Thus, while a conventional FET uses a gate contact to control conductance of the semiconductor between the source and drain (e.g., the channel), the semiconductor device 100 allows receptors formed on the opposing side of the FET device to control the conductance, while the gate structure 102 (e.g., polysilicon) provides a back gate (e.g., source substrate or body node in a conventional FET). The gate structure 102 provides a back gate that can control the channel electron distribution without a bulk substrate effect. Thus, if molecules attach to receptors provided on the metal crown structure 126, the resistance of the field-effect transistor channel region is altered. In some embodiments, a front gate bias is used instead of a back gate bias. The front gate electrode is located proximate to the sensing surface. Therefore, the semiconductor device 100 may be used to detect one or more specific biomolecules or bio-entities in the analyte environment around and/or in the opening 112.

The semiconductor device 100 may include additional passive components such as resistors, capacitors, inductors, and/or fuses; and other active components, including P-channel field effect transistors (PFETs), N-channel field effect transistors (NFETs), metal-oxide-semiconductor field effect transistors (MOSFETs), complementary metal-oxide-semiconductor (CMOS) transistors, high voltage transistors, and/or high frequency transistors; other suitable components; and/or combinations thereof. It is further understood that additional features can be added in the semiconductor device 100, and some of the features described below can be replaced or eliminated, for additional embodiments of the semiconductor device 100.

Figure 2A:
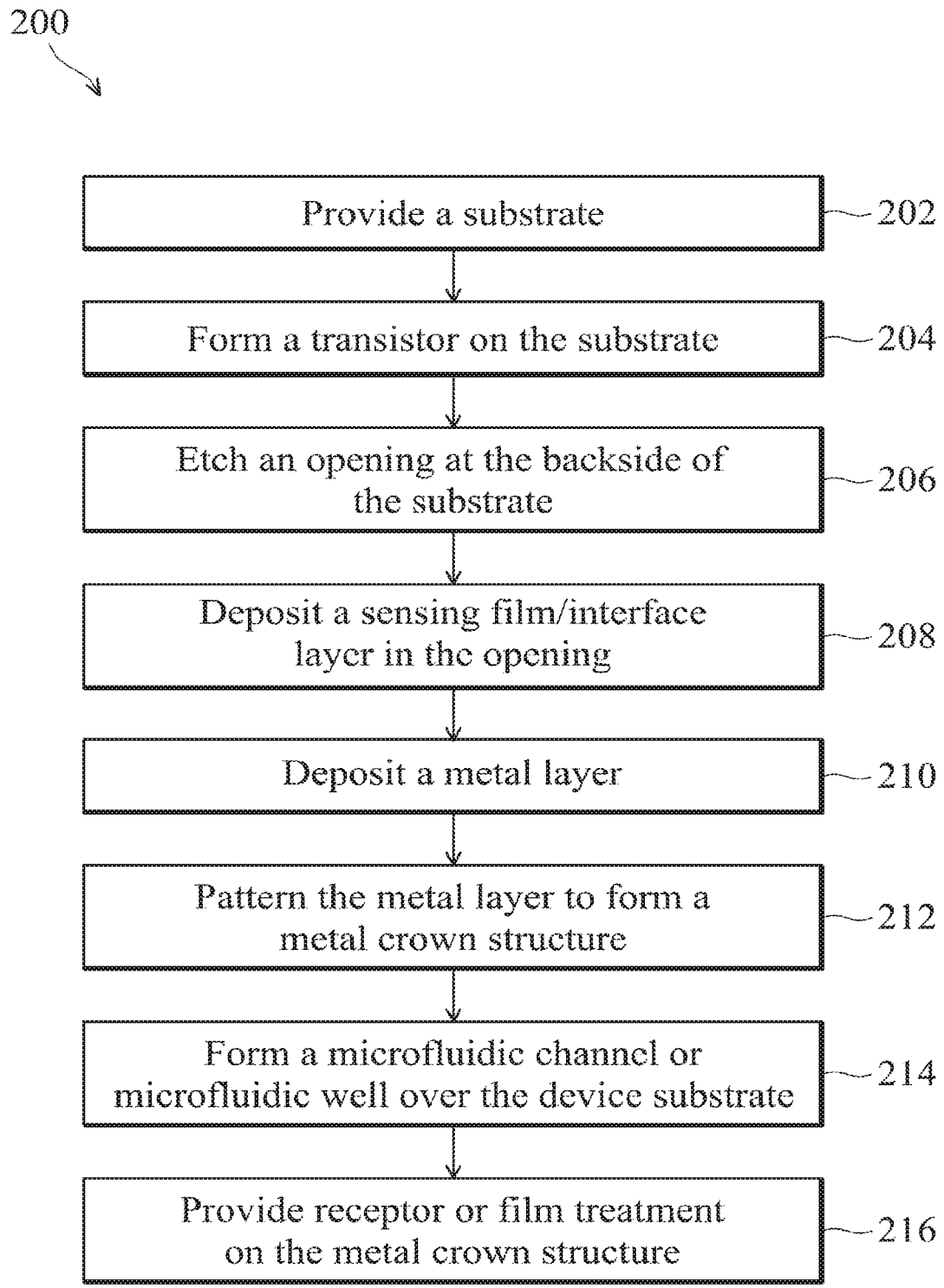
FIGS. 2A and 2B are flow charts of various embodiments of a method of fabricating a BioFET device according to one or more aspects of the present disclosure.

FIG. 2A is process flow diagram of a method 200 for making a BSS biological field effect transistor (BioFET). The method 200 includes forming a BioFET using one or more process operations compatible with or typical of complementary metal-oxide-semiconductor (CMOS) process. It is understood that additional steps can be provided before, during, and after the method 200, and some of the steps described below can be replaced or eliminated in different embodiments of the present disclosure. Further, it is understood that the method 200 includes steps having features of a typical CMOS technology process flow and those are only described briefly herein.

Figure 3:
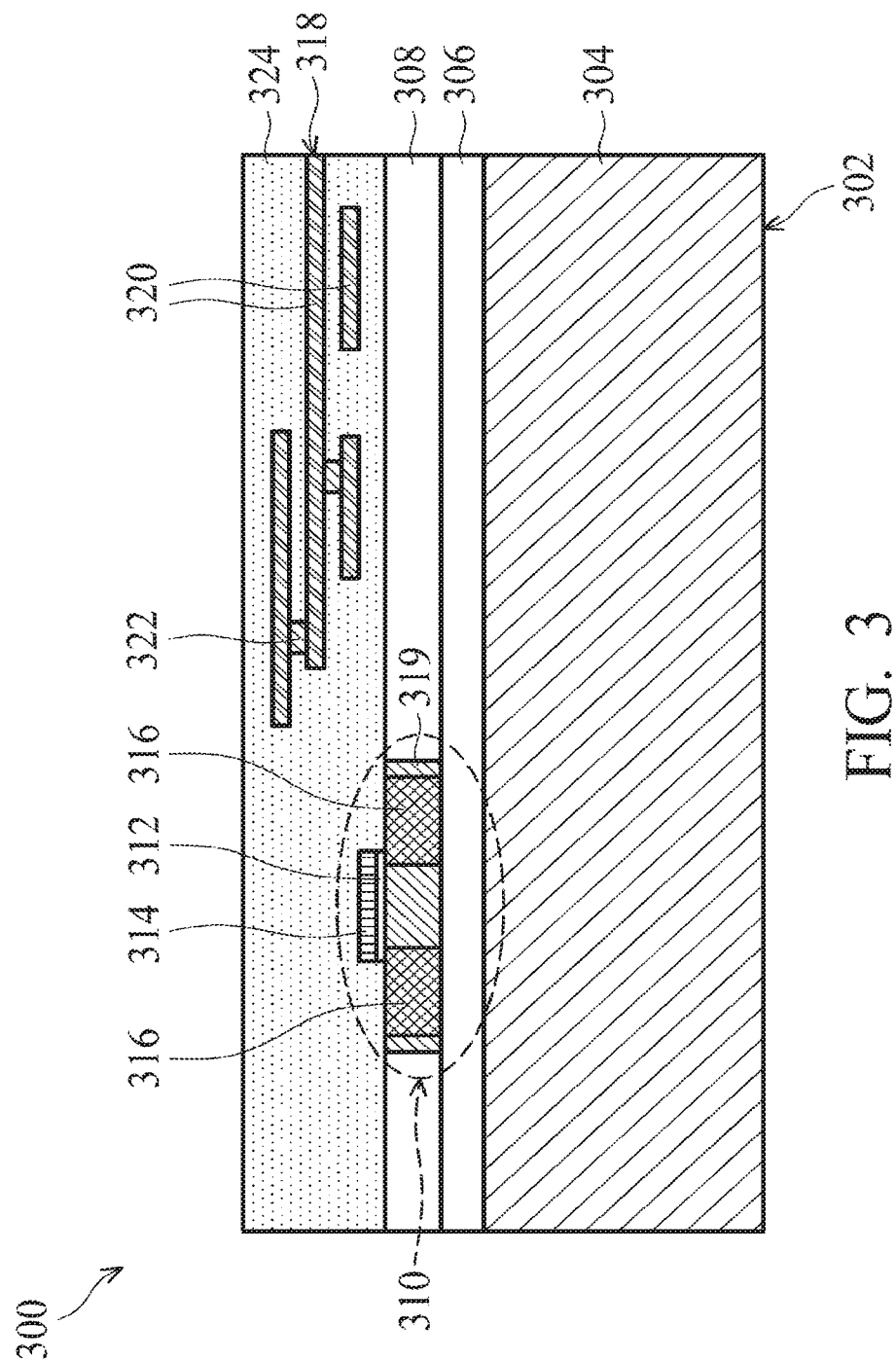
FIGS. 3-15 are cross-sectional views of various embodiments of a BioFET device constructed according to the present disclosure.

The method 200 begins at operation 202 where a substrate is provided. The substrate is a semiconductor substrate. The semiconductor substrate may be a silicon substrate or wafer. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In various embodiments, the substrate is a semiconductor-on-insulator (SOI) substrate. The SOI substrate may include a buried oxide (BOX) layer formed by a process such as separation by implanted oxygen (SIMOX), and/or other suitable processes. The substrate may be doped, such as p-type and n-type. As used herein, workpiece refers to a substrate together with any material bonded or deposited thereon. The semiconductor substrate (or device substrate) refers to the base material on and in which the devices are built and does not include any deposited or bonded material. FIG. 3 is a cross section of a partially fabricated BioFET 300 having a substrate 302. In the example of FIG. 3, the substrate 302 is an SOI substrate including a bulk silicon layer 304, an oxide layer 306, and an active layer 308. The oxide layer 306 may be a buried oxide (BOX) layer. In an embodiment, the BOX layer is silicon dioxide (SiO2). The active layer 308 may include silicon. The active layer 308 may be suitably doped with n-type and/or p-type dopants.

Referring to FIG. 2A, the method 200 then proceeds to operation 204 where a field effect transistor (FET) is formed on the substrate. The FET may be an n-type FET (nFET) or a p-type FET (pFET). The FET includes a gate structure, a source region, a drain region, and a channel region between the source and drain regions. For example, the source/drain regions may comprise n-type dopants or p-type dopants depending on the type of FET. The gate structure includes a gate dielectric layer, a gate electrode layer, and/or other suitable layers. In some embodiments, the gate electrode is polysilicon. Other gate electrodes include metal gate electrodes including material such as, Cu, W, Ti, Ta, Cr, Pt, Ag, Au, suitable metallic compounds like TiN, TaN, NiSi, CoSi, or combinations of these conductive materials. In various embodiments, the gate dielectric is silicon oxide. Other gate dielectrics include silicon nitride, silicon oxynitride, a dielectric with a high dielectric constant (high k), and/or combinations thereof. Examples of high k materials include hafnium silicate, hafnium oxide, zirconium oxide, aluminum oxide, tantalum pentoxide, hafnium dioxide-alumina (HfO2-Al2O3) alloy, or combinations thereof. The FET may be formed using typical CMOS processes such as, photolithography; ion implantation; diffusion; deposition including physical vapor deposition (PVD), metal evaporation or sputtering, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), spin on coating; etching including wet etching, dry etching, and plasma etching; and/or other suitable CMOS processes.

FIG. 3 is a cross section of a partially fabricated BioFET 300 having a substrate 302. A transistor element 310 is disposed on the substrate 302. The transistor element 310 includes a gate dielectric 312, a gate electrode 314, and source/drain regions 316 disposed in a well 319. The source/drain regions 316 and the well 319 may include opposite-type (e.g., n-type, p-type) dopants. The gate electrode 314 is a polysilicon gate or a metal gate. In some embodiments, the gate dielectric 312 is a gate oxide layer (e.g., SiO2, HfO2, or other high k metal oxide).

After forming the FET on the substrate, a multi-layer interconnect (MLI) structure is formed on the substrate. The MLI structure may include conductive lines, conductive vias, and/or interposing dielectric layers (e.g., interlayer dielectric (ILD)). The MLI structure may provide physical and electrical connection to the transistor. The conductive lines may comprise copper, aluminum, tungsten, tantalum, titanium, nickel, cobalt, metal silicide, metal nitride, poly silicon, combinations thereof, and/or other materials possibly including one or more layers or linings. The interposing or inter-layer dielectric layers (e.g., ILD layer(s)) may comprise silicon dioxide, fluorinated silicon glass (FGS), SILK (a product of Dow Chemical of Michigan), BLACK DIAMOND (available from Applied Materials of Santa Clara, California), and/or other insulating materials. The MLI may be formed by suitable processes typical in CMOS fabrication such as CVD, PVD, ALD, plating, spin-on coating, and/or other processes.

Referring to the example of FIG. 3, an MLI structure 318 is disposed on the substrate 302. The MLI structure 318 includes a plurality of conductive lines 320 connected by conductive vias or plugs 322. In an embodiment, the conductive lines 320 include aluminum and/or copper. In an embodiment, the vias 322 include tungsten. In another embodiment, the vias 322 include copper. A dielectric layer 324 is disposed on the substrate 302 including interposing the conductive features of the MLI structure 318. The dielectric layer 324 may be an inter-layer dielectric or ILD layer (sometimes referred to as an inter-metal dielectric, or IMD layer) and/or composed of multiple ILD sub-layers. In an embodiment, the dielectric layer 324 includes silicon oxide. The MLI structure 318 may provide electrical connection to the gate 314 and/or the source/drain 316.

Referring back to FIG. 2A, in operation 206, an opening is formed at the backside of the substrate. The opening is a trench formed in one or more layers disposed on the backside of the substrate. The opening exposes a region of the substrate underlying the gate and adjacent to the channel region of the FET. The opening may be formed using suitable photolithography processes to provide a pattern on the substrate and etching processes to remove materials form the backside until the body structure of the FET device is exposed. Suitable etching processes include wet etch, dry etch, including plasma etch and/or other suitable processes.

Figure 2B:
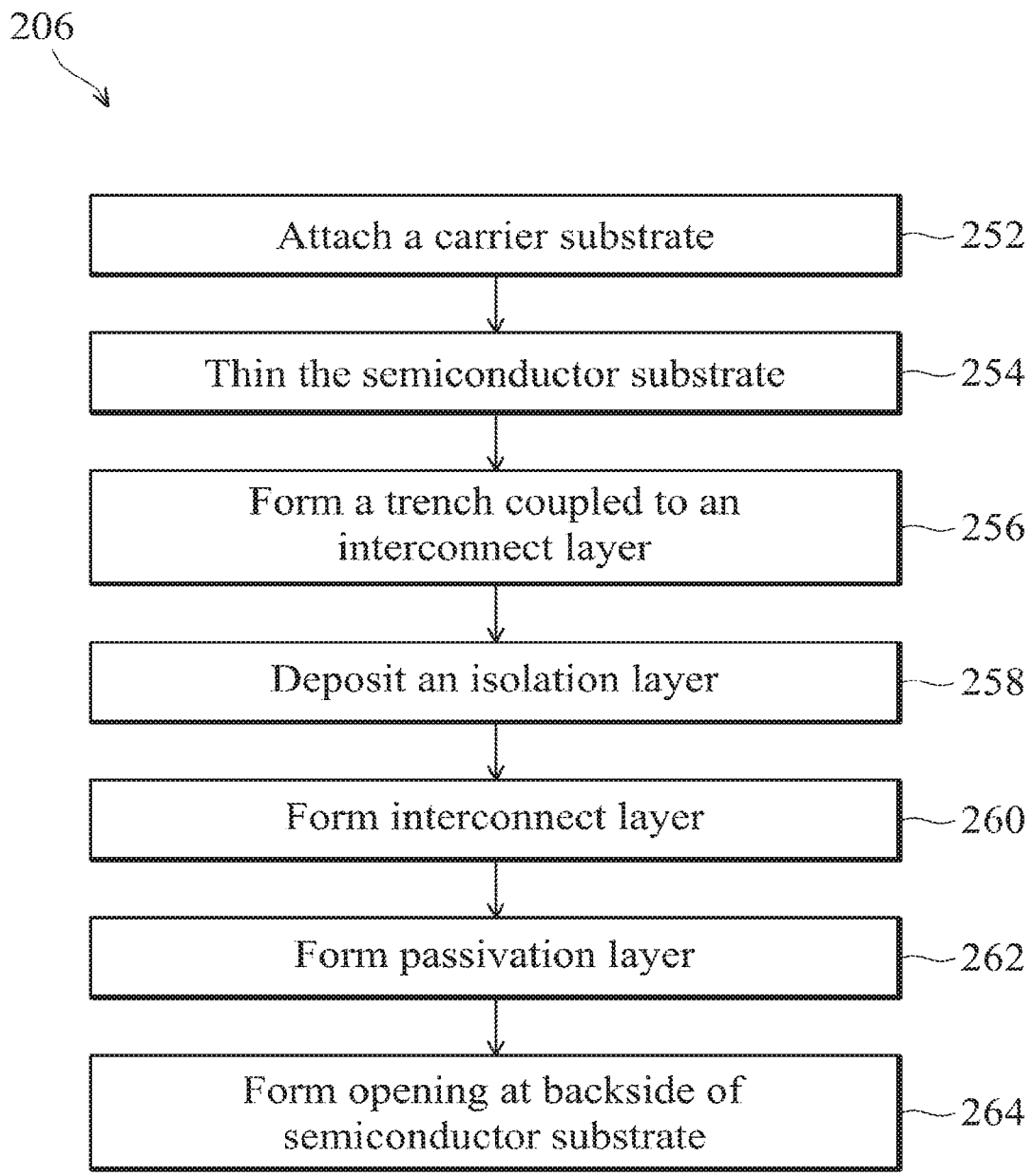
Figure 4:
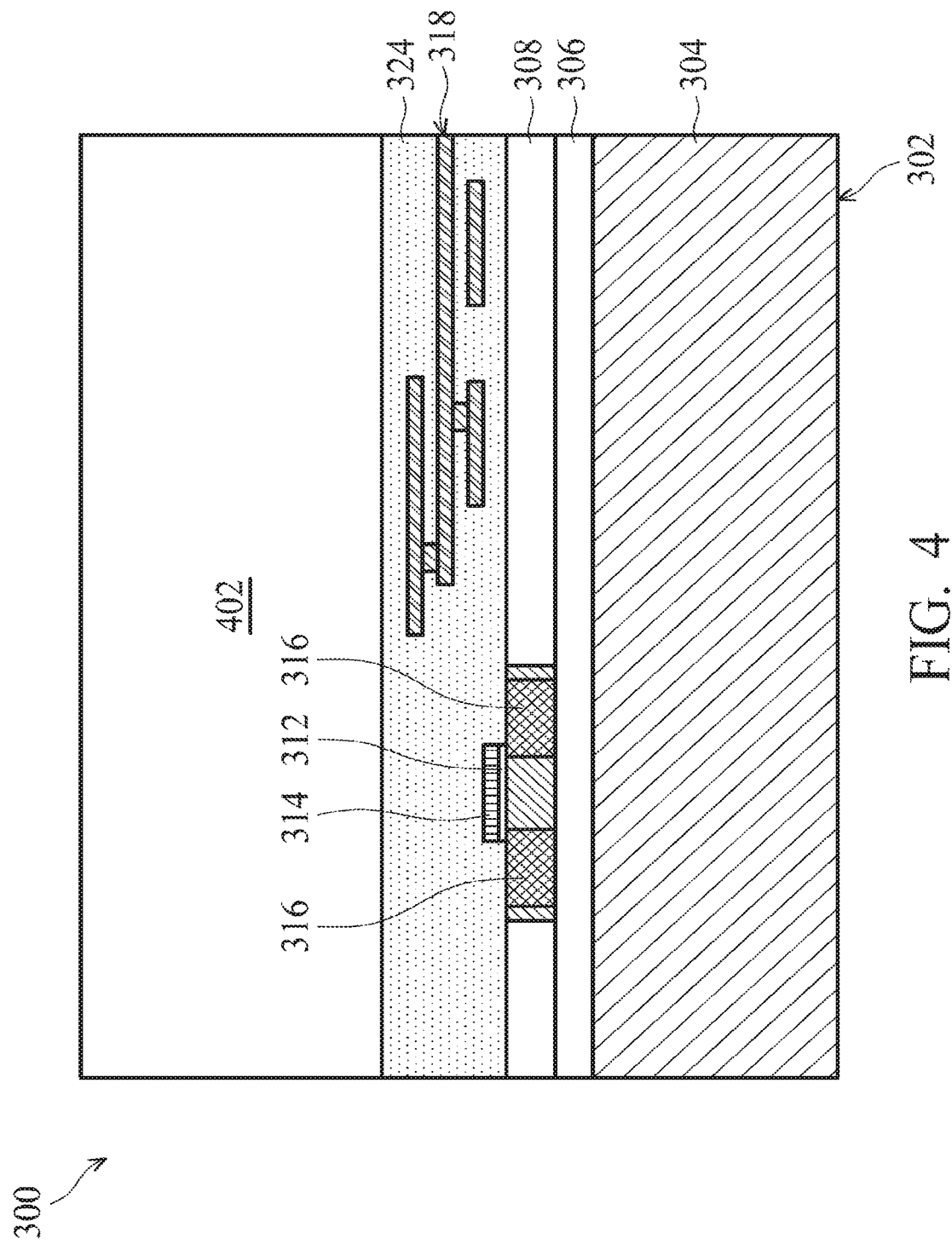

In some embodiments, details of the forming the opening operation includes a number of steps as shown in process diagram of FIG. 2B and cross sections of FIGS. 4 to 10. In operation 252 of FIG. 2B, a carrier substrate is attached. As shown in FIG. 4, a carrier substrate 402 is attached (e.g., bonded) to the device substrate 302. The carrier substrate 402 is attached to the front side of the device substrate 302 over the MLIs. In an embodiment, the carrier substrate is bonded to a passivation layer formed on the MLI and/or ILD layers of the substrate. The carrier substrate may be attached to the device substrate using fusion, diffusion, eutectic, and/or other suitable bonding methods. Example carrier substrates include silicon, glass, and quartz. The carrier substrate 402 may include other functionality such as, interconnect features, wafer bonding sites, defined cavities, and/ or other suitable features. The carrier substrate may be removed during subsequent processing (e.g., after thinning).

In operation 254 of FIG. 2B, the semiconductor substrate is thinned. The device substrate is flipped. The device substrate may be thinned using wet etch processes, dry etch processes, plasma etch processes, chemical mechanical polish (CMP) processes, and/or other suitable processes for removing portions of the semiconductor substrate. Example etchants suitable for thinning the substrate include HNA (hydrofluoric, nitric, and acetic acid), tetramethylammonium hydroxide (TMAH), KOH, buffered oxide etch (BOE), and/or other suitable etchants compatible with CMOS process technology.

Figure 5:
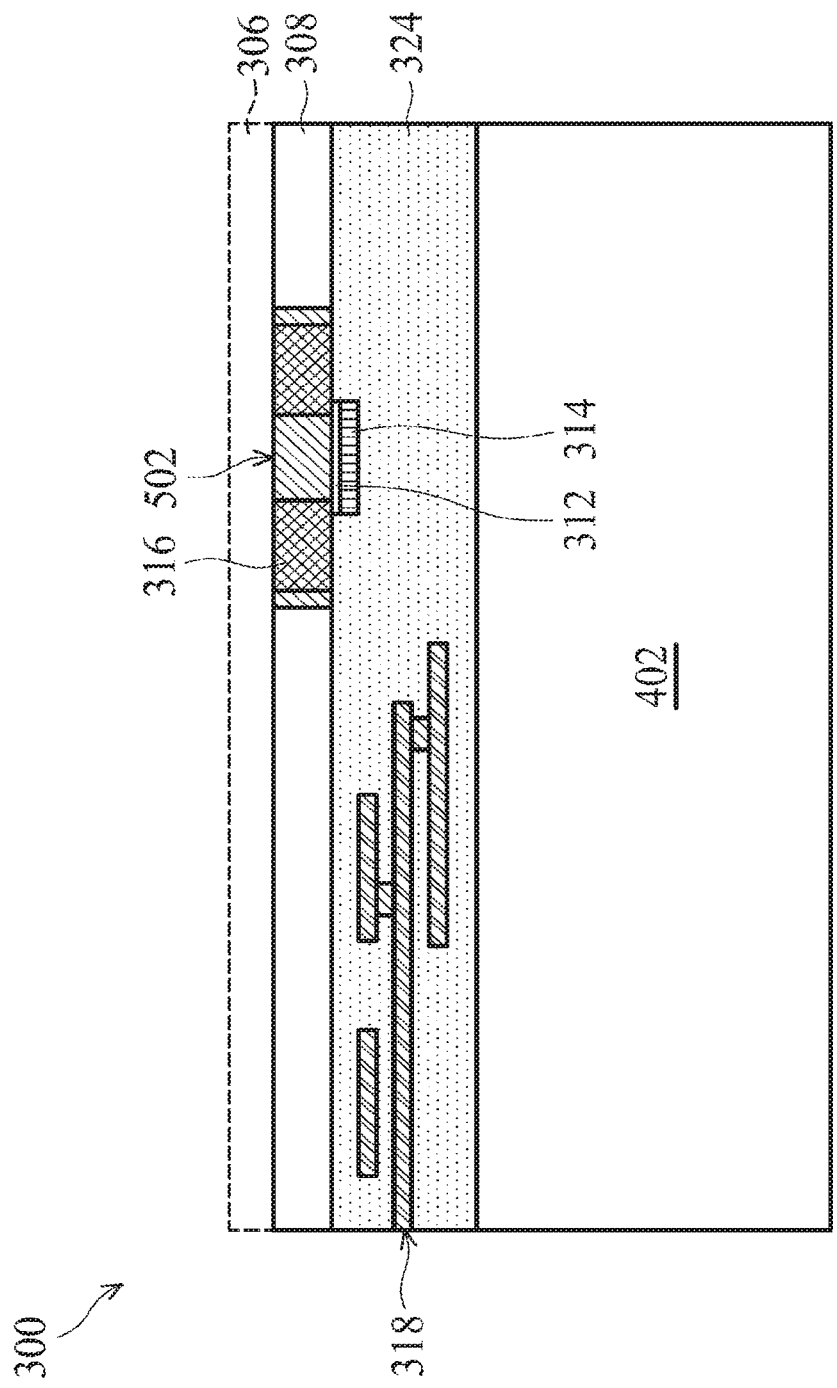
Figure 6:
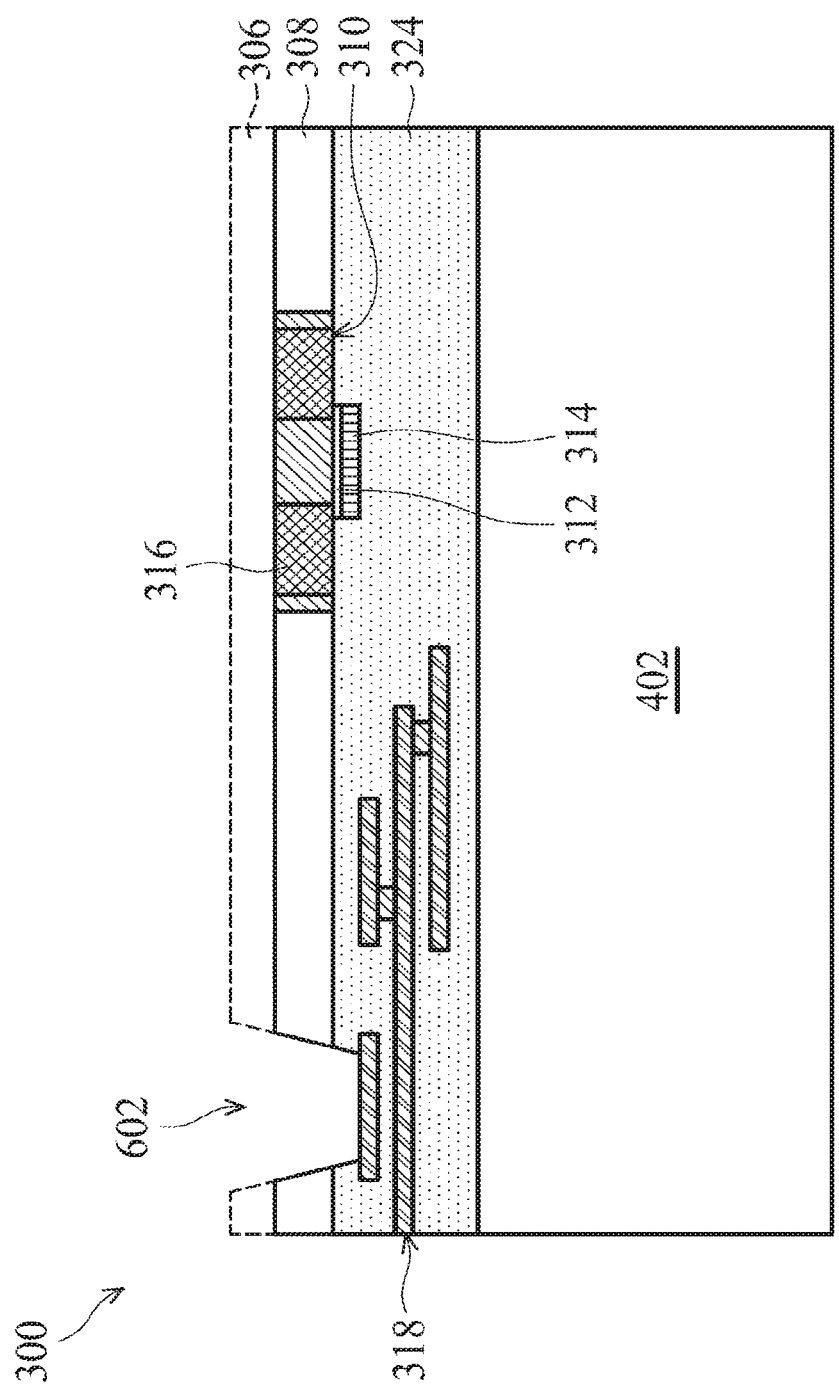
Figure 7:
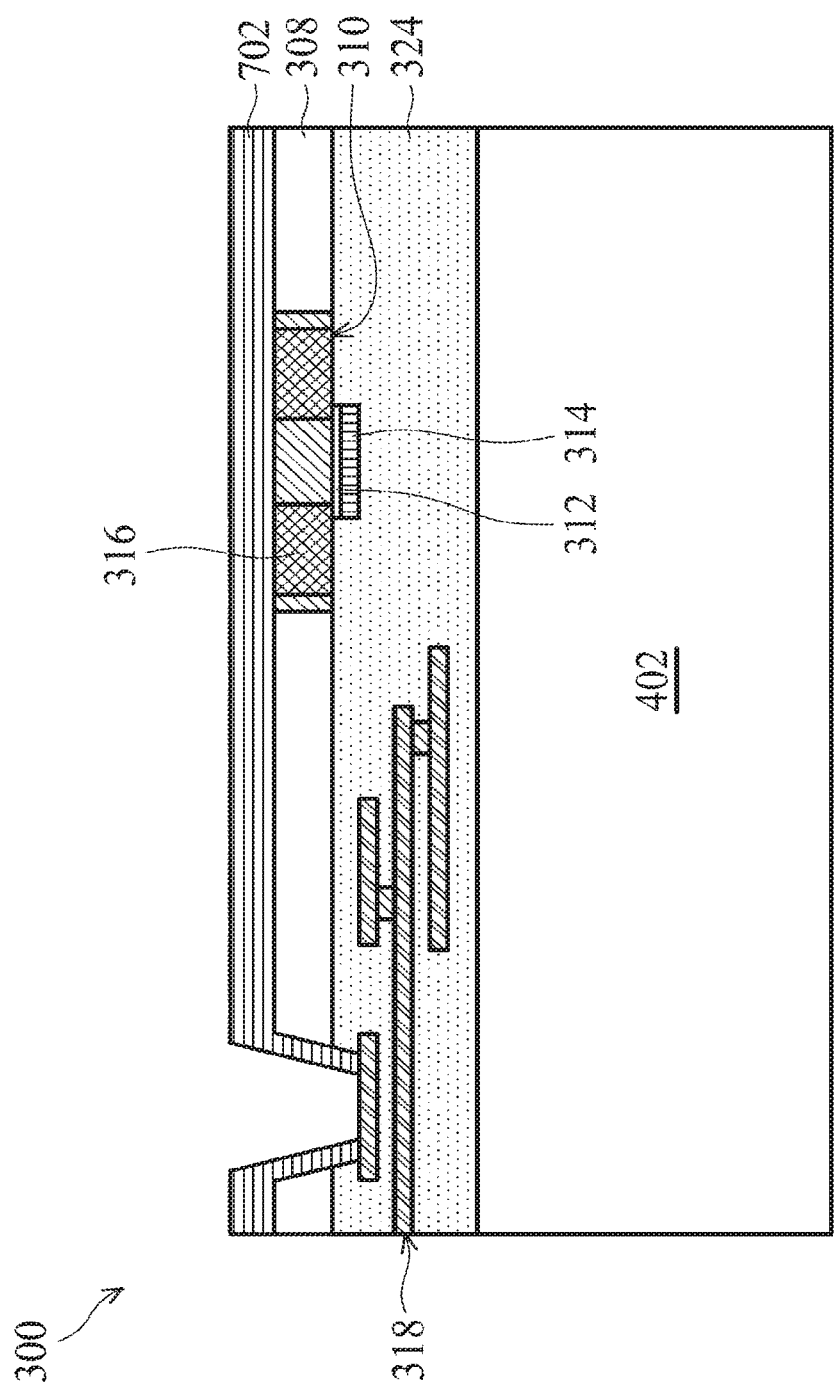
Figure 8:
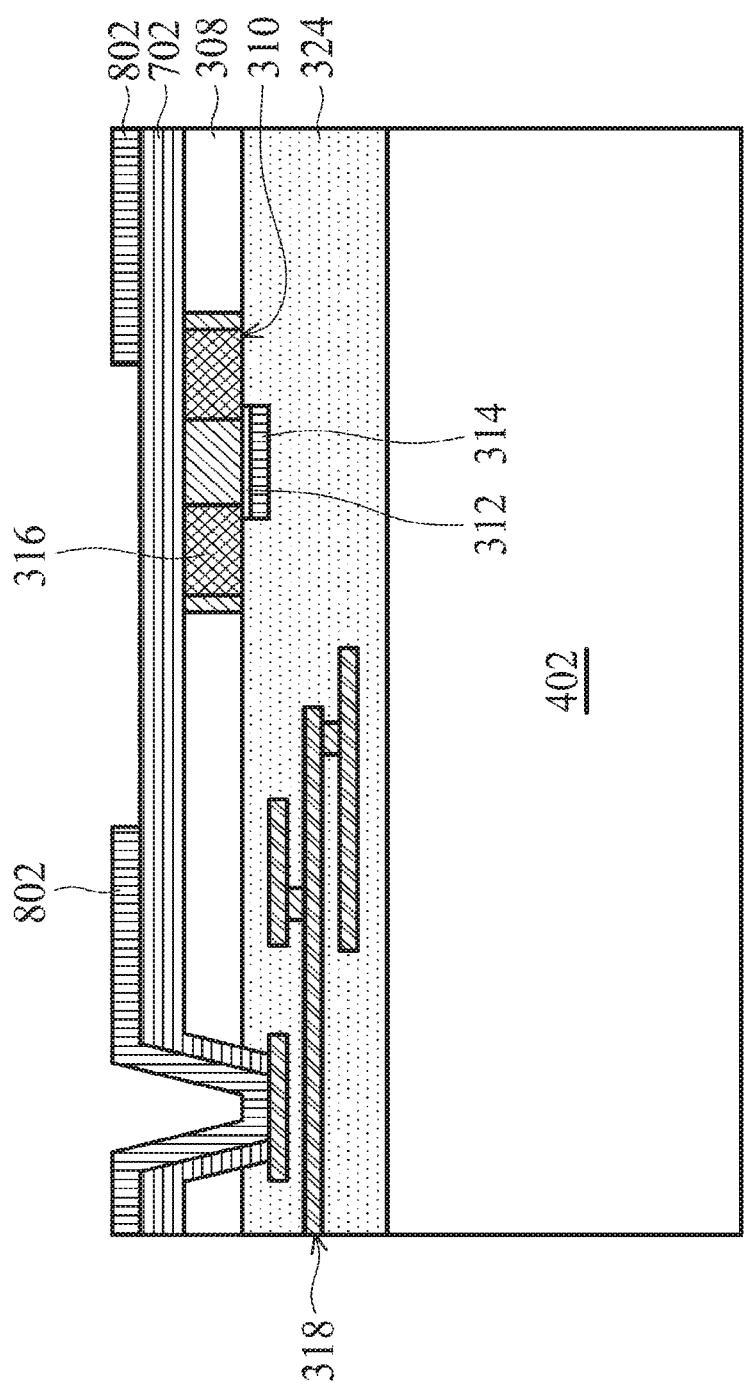
Figure 9:
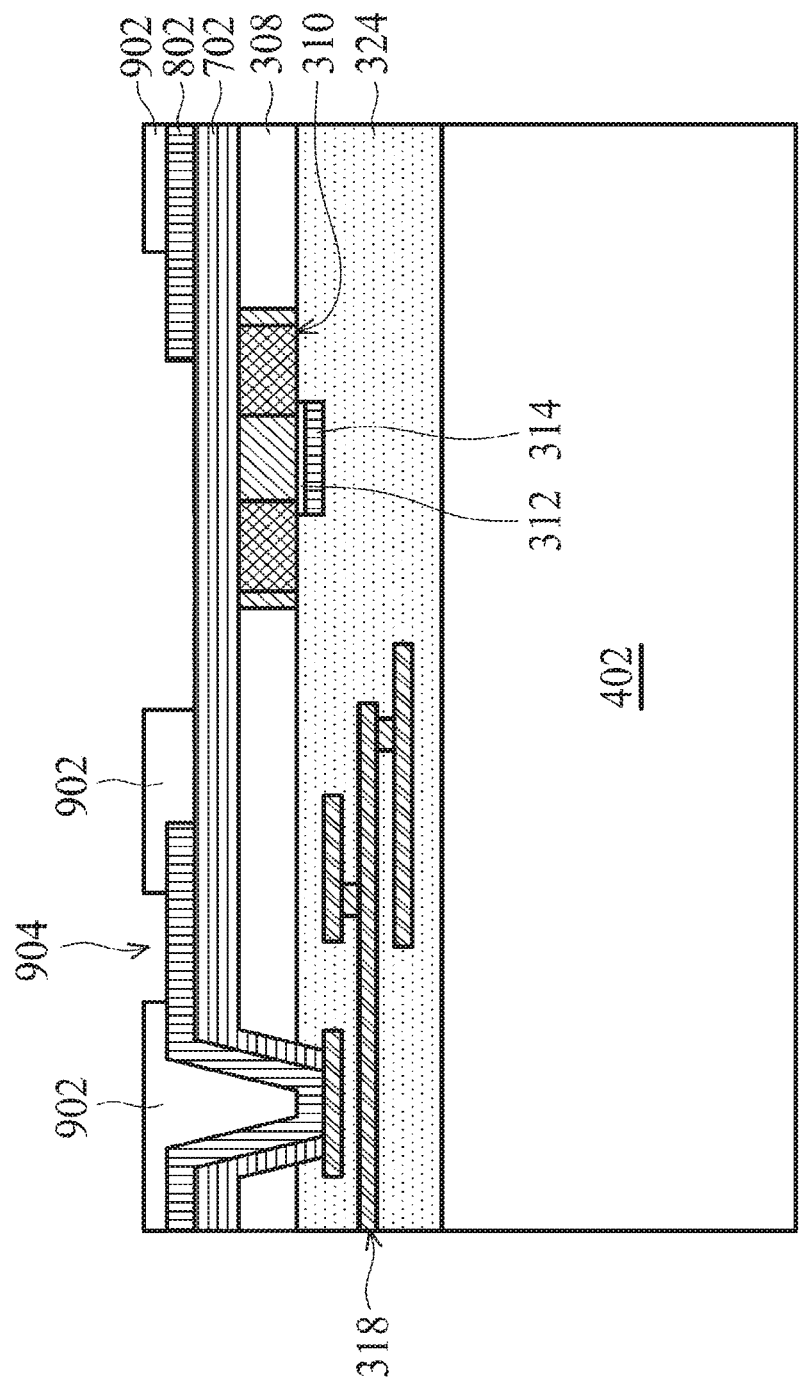

In FIG. 5, the device substrate is thinned such that the bulk silicon layer and the buried insulating layer are removed. The device substrate may be thinned in a plurality of process steps, for example, first removing the bulk silicon layer of an SOI wafer followed by removal of a buried insulating layer of the SOI wafer. In an embodiment, a first thinning process includes removal of the bulk silicon using, for example, CMP, HNA, and/or TMAH etching, which stops at the buried oxide layer. The first thinning process may be followed by a second thinning process, such as BOE wet etch, which removes the buried oxide and stops at the silicon of the active layer. The thinning process may expose an active region of the substrate 502. In an embodiment, a channel region (e.g., active region interposing the source/drain regions and underlying the gate structure) is exposed. The substrate may have a thickness of approximately 500 Angstroms (Å) to 1500 Å after the thinning process. For example, in one embodiment the active region of an SOI substrate has a thickness of between of approximately 500 Å and 1500 Å.

In other embodiments, the device substrate is thinned such that the bulk silicon layer is removed, and the buried insulating layer remains on the substrate. The removal of the bulk silicon may be performed using, for example, CMP, HNA, and/or TMAH etching, which stops at the buried insulating layer. The substrate may have a thickness of approximately 500 Angstroms (Å) to 1500 Å after the thinning process. For example, in one embodiment the active region of an SOI substrate has a thickness of between of approximately 500 Å and 1500 Å. The buried insulating layer (now providing the surface of the substrate) may be the isolation layer. FIG. 5 shows the buried insulating layer 306 with a dotted outline for the example when it is not removed.

In operation 256 of FIG. 2B, a trench is formed on the substrate to expose and provide contact to one or more of the conductive traces of the MLI structure. The trench may be formed by photolithography processes to pattern the trench opening followed by suitable wet, dry or plasma etching processes. In an embodiment, the trench exposes a portion of a metal one (metal1) layer of the MLI (e.g., the first metal layer formed in the MLI structure after the gate structure is formed). Referring to the example of FIG. 6, a trench 602 is etched in the substrate 302, specifically through the active layer 308, to expose a landing region on a conductive line 320 of the MLI structure 318. Alternatively, the trench may be etched through the isolation region 306 (e.g., oxide).

In operation 258 of FIG. 2B, an isolation layer is formed on the substrate. The isolation layer may include a dielectric material such as an oxide or nitride. In an embodiment, the isolation layer is silicon oxide. Referring the example of FIG. 7, an isolation layer 702 is disposed on the active layer 308. In an embodiment, the isolation layer 702 is silicon dioxide. As discussed above, in an embodiment, an isolation layer is not formed as the insulating layer of the SOI substrate remains on the substrate and functions to replace the need (in whole or in part) for a separate isolation layer. As shown, portions of isolation layer 702, specifically those directly overlying the landing region of conductive line 320, are removed.

In operation 260 of FIG. 2B, an interconnect layer is formed and patterned on the isolation layer 702. The interconnect layer may provide a connection (e.g., I/O connection) to the MLI structure. The interconnect layer may provide a connection (e.g., I/O connection) to the transistor 310. The interconnect layer may include a conductive material such as, copper, aluminum, combinations thereof, and/or other suitable conductive material. The interconnect layer may provide functions as a re-distribution layer (RDL). Referring to the example of FIG. 8, an interconnect layer 802 is disposed on the insulating layer 702. The interconnect layer 802 may provide a signal input/output to the transistor 310. In an embodiment, the interconnect layer 802 includes an aluminum copper alloy.

In operation 262 of FIG. 2B, a passivation layer is formed on the device substrate. The passivation layer may cover portions of the interconnect layer. The passivation layer may include openings where a bond (e.g., I/O) may be formed. In an embodiment the passivation layer includes silicon dioxide, however, other compositions are possible. The passivation layer may be suitable to provide protection of the device, e.g., the interconnect layer, including from moisture. Referring to the example of FIG. 9, a passivation layer 902 is formed on the substrate including on the interconnect layer 802. The passivation layer 902 includes an opening 904 where a bond (e.g., wire bond, bump) may provide connection (e.g., I/O connection) to the device 300. In other words, the opening 904 may expose a conductive I/O pad.

Figure 10:
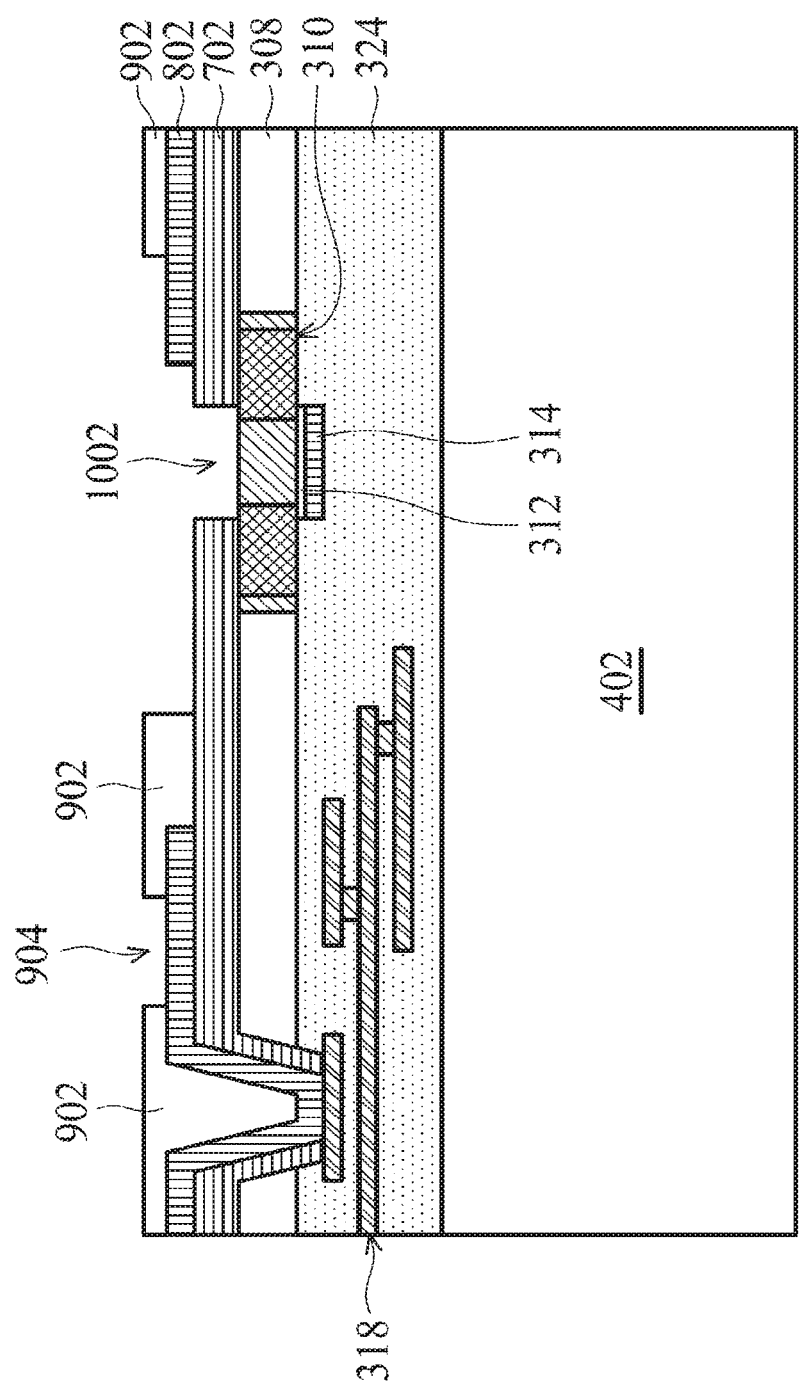

In operation 264 of FIG. 2B, an opening is formed on the backside of the substrate. The opening may be formed such that a portion of the active region of the substrate underlying the transistor structure (e.g., channel region) is exposed. The opening may be substantially aligned with the gate structure of the transistor. The opening may be formed by suitable photolithography processes followed by an etching process such as a dry etch, wet etch, plasma etch, and/or combinations thereof. In an embodiment, the opening is formed in the isolation layer. In an embodiment, the opening is formed in the buried insulator layer (of the SOI substrate). Referring to FIG. 10, an opening 1002 is provided. The opening 1002 exposes a portion of the active layer 308. In particular, a channel region 302 of the active layer 308 may be exposed. Further, a portion of the source and/or drain region may be exposed. The embodiments of FIG. 2B pertain to aspects of the present disclosure where the electrical connections for the BioFET device are made on the same side of the substrate as the fluidic connections.

The present disclosure also pertains to embodiments where the electrical connections for the BioFET device are made to the opposite side of the substrate as the fluidic connections. In those embodiments, electrodes and pads are formed connecting to the MLI on the front side of the substrate before the carrier substrate is bonded and device substrate thinned. From the backside, trench 602 is not formed.

Figure 11:
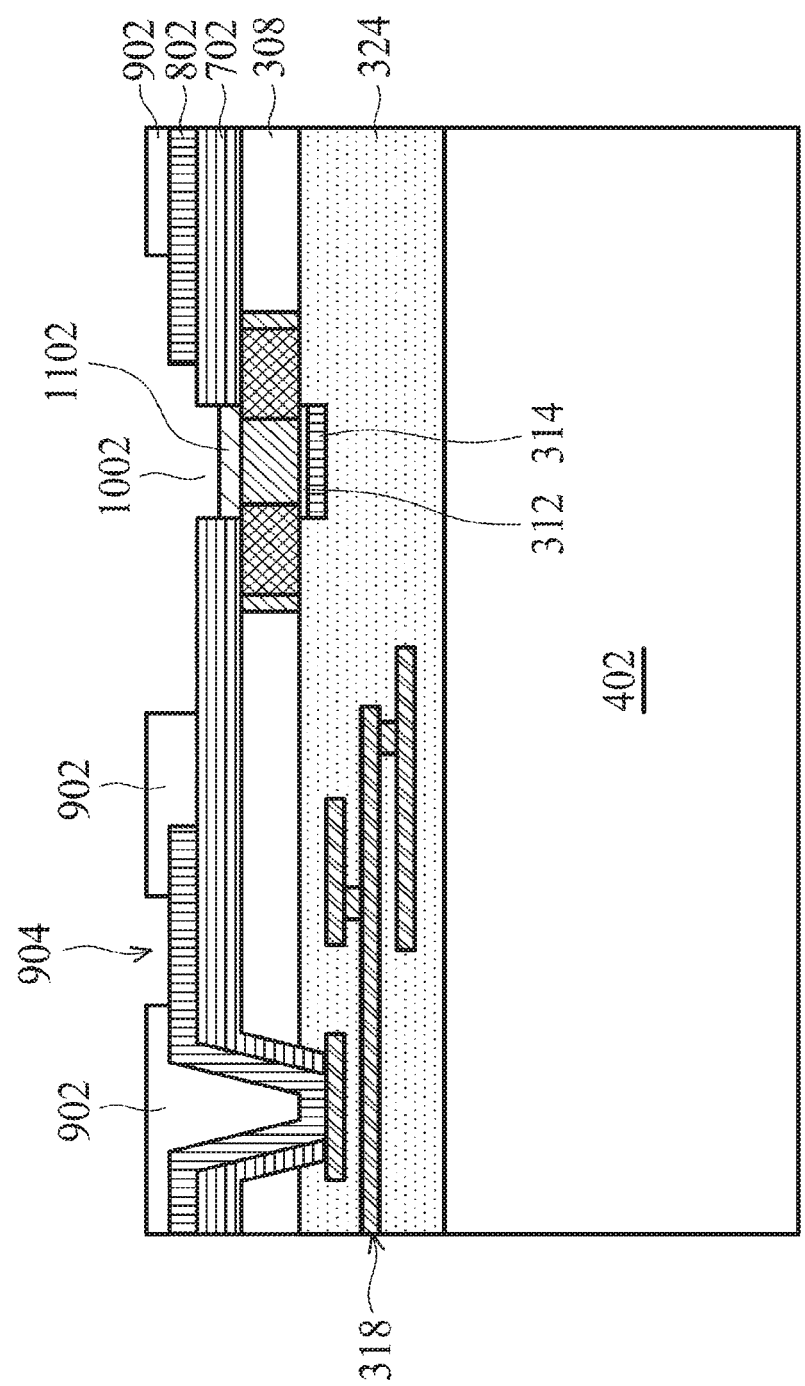

Referring back to FIG. 2A, in operation 208 an interface layer is formed in the opening. The interface layer is formed on the exposed substrate underlying the gate structure of the FET and covers the entire bottom of the opening 1002. Exemplary interface materials include high-k dielectric films, metal oxides, dielectrics, and/or other suitable materials. Specific example of interface materials include HfO2, Ta2O5, oxides of Pt, Au, W, Ti, Al, and Cu, and other dielectrics such as SiO2, Si3N4, Al2O3, TiO2, TiN, SnO, SnO2, among others. The interface layer may be formed using CMOS processes such as, for example, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). In some embodiments, the interface layer includes a plurality of layers. In the example of FIG. 11, an interface layer 1102 is disposed on the active layer 308 and a portion of the source and drain. The interface layer 1102 can be patterned to be aligned with the gate structure (e.g., is disposed and patterned to remain only in the opening 1002.)

Referring back to FIG. 2A, in operation 210 a metal layer is deposited. The metal layer may be an elemental metal, metal alloy, or a conductive metallic compound. Suitable elemental metals include tantalum, tantalum, niobium, tungsten, ruthenium, or other transition metal commonly used in semiconductor process. The metallic compound includes conductive nitride and oxides of these transition metals. For example, tungsten nitride, tantalum nitride, and ruthenium oxide. The metal layer may be a composite layer of two or more layers. For example, the metal layer may include both tungsten nitride and ruthenium oxide.

The metal layer is deposited conformally over the substrate and in the opening covering the interface layer. The metal layer may be deposited using a PVD (sputtering), metal chemical vapor deposition (MCVD), atomic layer CVD (ALCVD), electrochemical deposition with a seed layer, or electroless deposition. In some embodiments, an ion beam deposition may be used to selectively deposit the metal layer in and around the opening.

In operation 212, the metal layer is patterned to form a metal crown structure. In some embodiments, the patterning involves removing, by etching, unwanted portions of the metal layer deposited in operation 210. An etch mask is first deposited and patterned. The etch mask may be a photoresist or a hardmask patterned by a photolithography process. In other embodiments, a photoresist material is first deposited and patterned on the substrate and removed after the metal layer is deposited. Lifting off the photoresist material also removes any overlying metal layers. The lift-off technique may be useful when the dry etch involving plasma to remove the metal pattern would cause undesirable amounts of plasma-induced damage to other exposed metal surfaces. Because the photoresist in the lift-off process may be removed with just wet etching or including low-power plasma etching, it is sometimes preferred over the metal patterning technique. However, the lift-off process has the potential to produce more contaminants and a shape of the resulting metal crown structure may include jagged edges.

Figure 12:
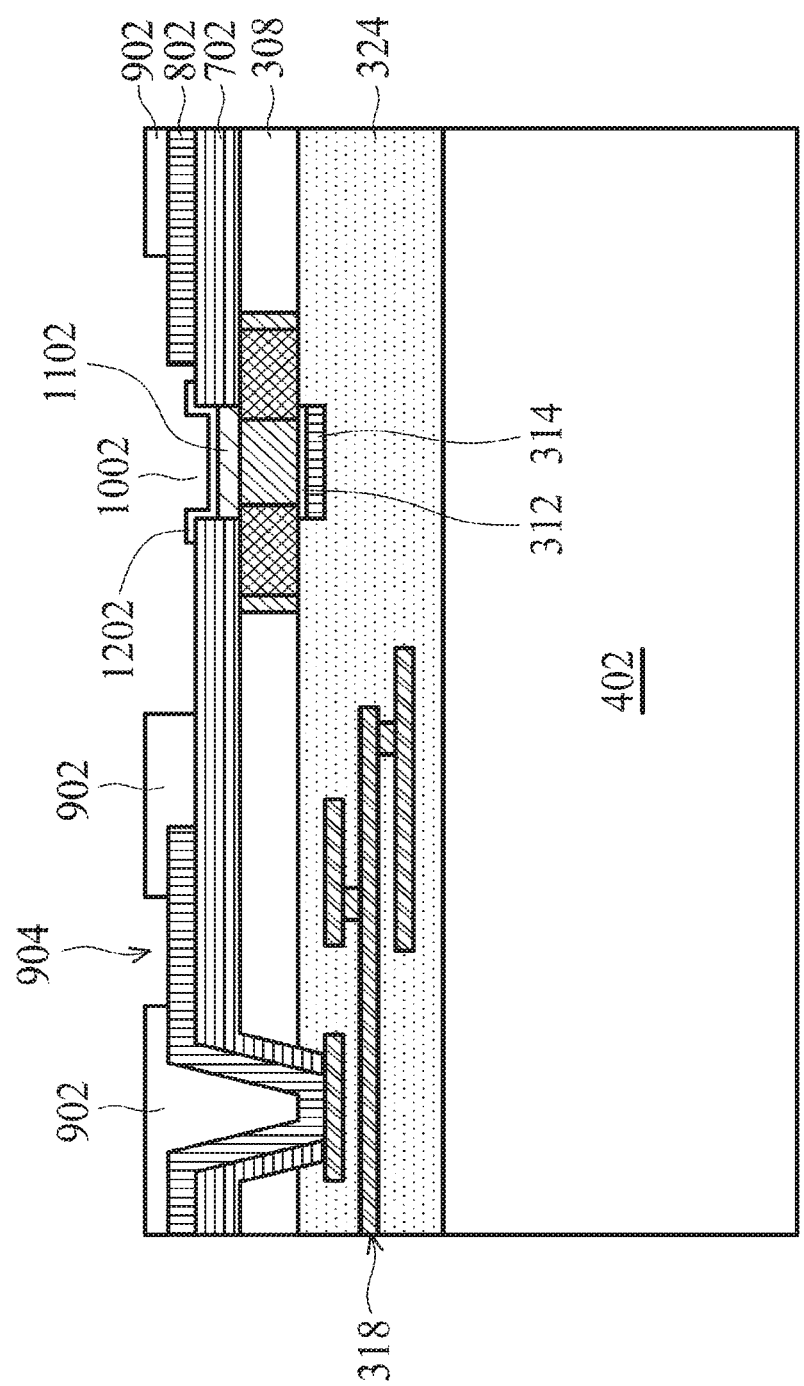

In the example of FIG. 12, a metal crown structure 1202 is disposed over an interface layer 1102 in and around the opening 1002. As shown, the metal crown structure 1202 includes a lip that overlaps a portion of the isolation layer 702. However, in some embodiments all of the metal crown structure 1202 is within the opening 1002.

According to various embodiments, the metal crown structure 1202 has a surface area that is about twice as large as the surface area of the interface layer 1102. The larger surface area allows more potential modulating reaction to take place on its surface. However, the area is not so large that significant resistance develops across the metal crown structure. Further, the area is not so large so that a high number of reactions would remove the BioFET from the linear region of the I-V curve into the saturation region. While the gate bias may be changed during operation to ensure that the BioFET stay in the linear region, the reduction in sensitivity and the concomitant increase in analyte concentration would reduce the benefit of the metal crown structure.

Figure 13:
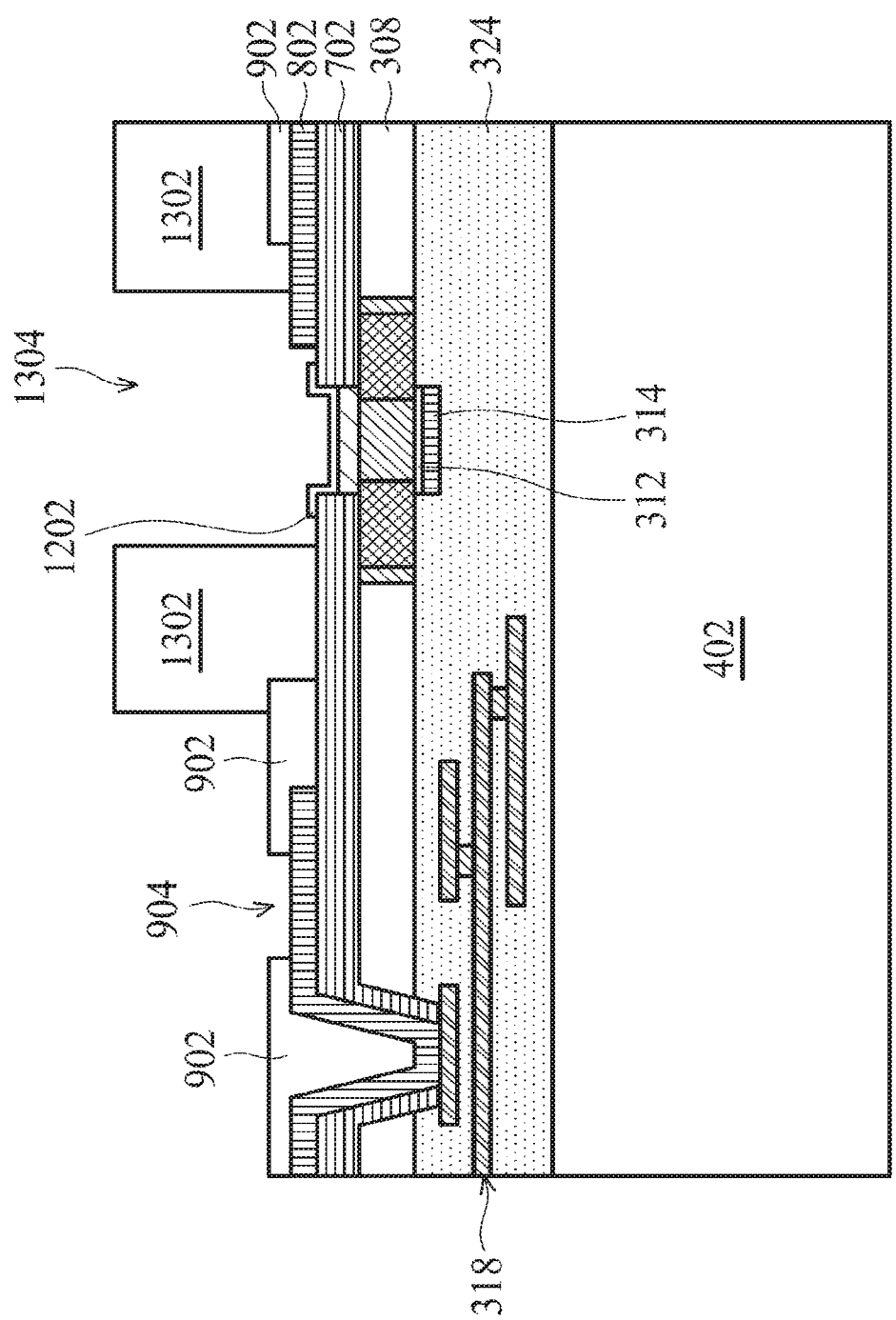

Referring back to FIG. 2A, in operation 214 a microfluidic channel or well is disposed on the device substrate. The fluidic channel defines a region overlying the metal crown structure through which the analyte flows. The fluidic channel may be formed by soft lithography utilizing polydimethylsiloxane (PDMS), wafer bonding methods, and/or other suitable methods. Referring to the example of FIG. 13, a fluidic channel 1302 is disposed on the substrate. The fluidic channel 1302 provides a well 1304 overlying the metal crown structure 1202.

Figure 14:
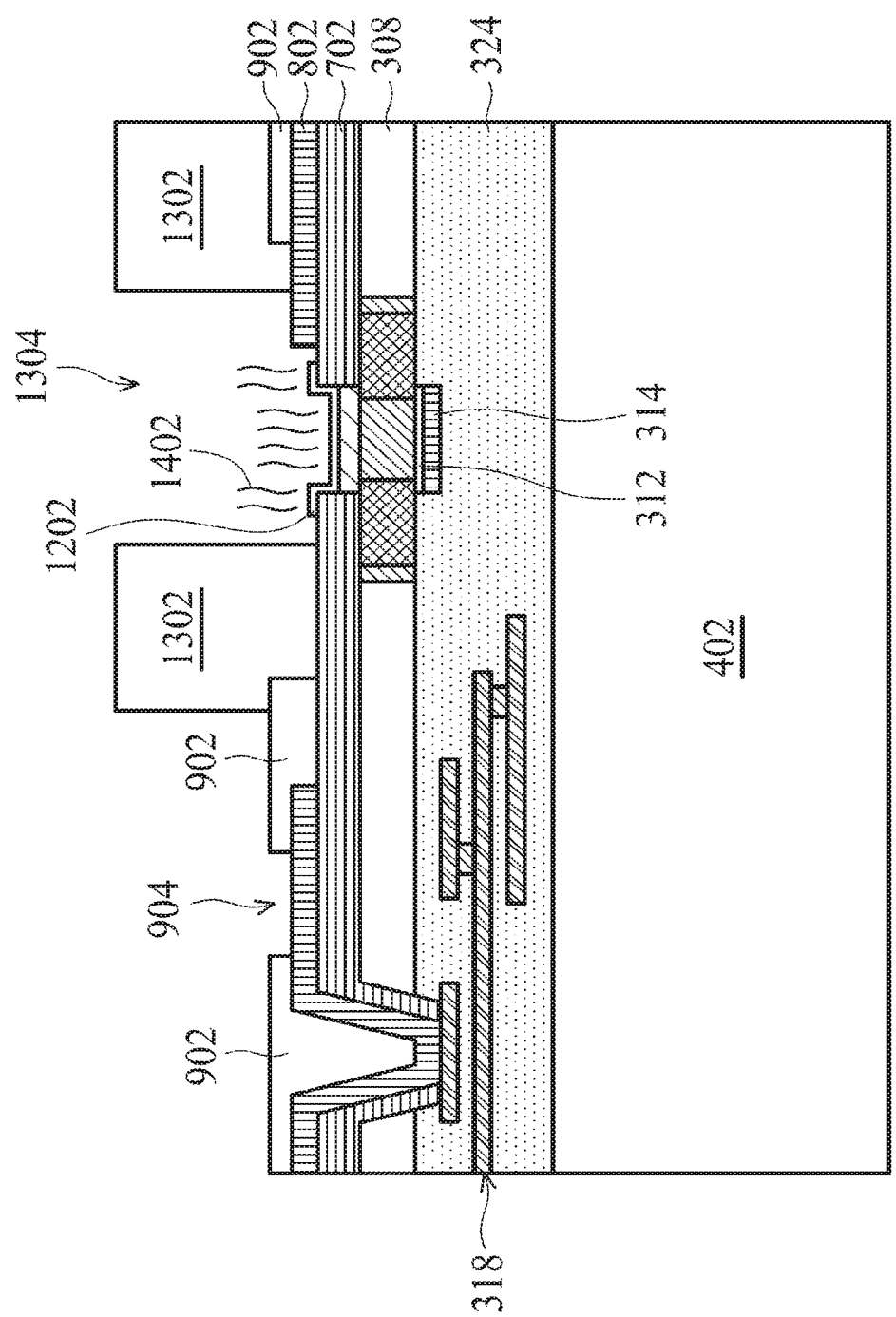

Referring back to FIG. 2A, in operation 216, a receptor or film treatment is disposed on the metal crown structure. The receptor may include enzymes, antibodies, ligands, protein, peptides, nucleotides, and portions of these. The receptor may be a modified form of a native protein or enzyme configured on one end to detect a specific analyte. The other end of the receptor is configured to bond to the metal crown structure or another molecule/film treatment that is bonded to the metal crown structure. As shown in FIG. 14, a plurality of receptors 1402 is disposed on metal crown structure 1202. By using a metal crown structure, a larger surface area is available to receptors for bonding and hence more sites are available for biomolecule or bio-entity detection.

In some embodiments, more than one type of metal crown structure is formed or deposited. Different metal crown structures may mean that the surface areas are different by patterning. Thus measurements from different regions of the transistor IV curve may be compared to determine the analyte concentration. In some examples, different materials are used in different sites. Because the receptors may be designed to have different affinities to different metal crown structure materials, a BioFET device may have several BioFETs configured to detect different biomolecules or bio-entities. For example, some sites may include a tantalum containing metal crown structure and other sites may include a ruthenium oxide containing metal crown structure. A receptor may be designed to have a higher affinity for one or the other of the surfaces. Another receptor may not be selective between the two. By exposing the selective receptor first through the microfluidic channel and wells, bonding sites on the high affinity surface may be occupied before the non-selective receptor is exposed to the surfaces. By designing receptors for different surfaces, a BioFET device can be used to design several biomolecules or bio-entities.

During operation of the BioFET device, a solution that contains target molecules is provided in the fluidic channel. The BioFET device may contain different areas for processing the target molecule. Some bio-material may be lysed, separated, dyed, and otherwise tested or analyzed using chemical, electrical, or optical means. For example, a drop of blood may be inserted in an inlet and initially separated by plasma and cell type. Certain cells in the blood drop may be lysed. Some macromolecules in the lysate may be further broken down for analysis by downstream in the flow path. Deoxyribonucleic acid (DNA) molecules may be fragmented by restriction or shearing into target strands.

After processing the bio-material into targets, the targets are detected by flowing through microfluidic channels and wells containing the BioFETs. The flow may be controlled such that the targets have a long residence time in the presence of the metal crown structure sensing surfaces as compared to the reaction time. In some embodiments, gate bias is varied while the current flown through the BioFET is collected. The electrical information from the BioFET are collected and analyzed.

In various embodiments, a CMOS fabrication facility (e.g., foundry) may process the methods in accordance with various embodiments for the associated device up to the fluidic channel formation. In an embodiment, a subsequent user may provide the surface treatment technologies, ionic solutions, receptors, and the like.

In summary, the methods and devices disclosed herein provide a BioFET that is fabricated using CMOS and/or CMOS compatible processes. Some embodiments of the disclosed BioFET may be used in biological and/or medical applications, including those involving liquids, biological entities, and/or reagents. One detection mechanism of some embodiments described herein includes a conductance modulation of the FET of the BioFET due to the binding of the target bio-molecule or bio-entity to the gate structure, or a receptor molecule disposed (e.g., immobilized) on the gate structure of a device.

Some embodiments of the BioFETs are arranged in an array form. They may include a back-gate for back-gate biasing to improve respond time and/or enhance sensitivity. The gate structures may be built on silicon-on-insulator (SOI) substrates. This may provide advantages in some embodiments of operation at a higher speed and/or consumption of less power. The inverted transistor provided on an SOI substrate may achieve improved fabrication uniformity, have improved process control, and the like. Some embodiments may provide for an improved short-channel effect, for example, due to the formation on a SOI substrate.

Thus, it will be appreciated that in one embodiment a BioFET device is described that includes a substrate, a transistor structure in the substrate, an isolation layer with an opening on a side of the substrate opposite from a gate structure of the transistor, an interface layer in the opening, and a metal crown structure over the interface layer and at least partially covering the sidewalls of the opening. The transistor structure has a gate structure over a source region, a drain region, and a channel region. The opening in the isolation structure is at the channel region of the transistor structure.

Figure 15:
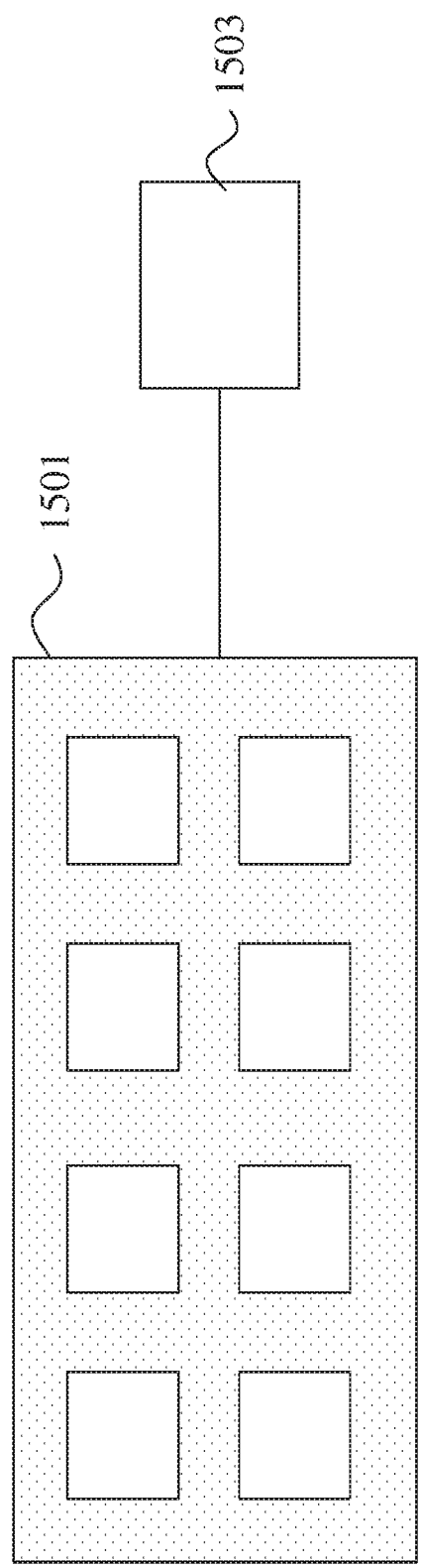

FIG. 15 illustrates one aspect of the present disclosure that pertains to a semiconductor device that includes an array 1501 of BioFET devices. The array 1501 is connected to at least one sense amplifier 1503. A first BioFET device in the array 1501 includes a gate structure formed on a substrate, a source region and a drain region formed in the substrate adjacent the gate structure, a channel region interposing the source and drain regions and underlying the gate structure, and an interface layer disposed on the channel region, and a metal crown structure over the interface layer, the metal crown structure having a larger surface area than the interface layer. The interface is disposed on a first side of the channel region and the gate structure is disposed on the opposing, second side of the channel region.

Another aspect of the present disclosure pertains to a method of fabricating a BioFET device includes forming a transistor on a semiconductor substrate and etching an opening in an isolation layer disposed on a second side of the semiconductor substrate to exposes the channel region of the transistor. The transistor includes a gate structure formed on a first side of the semiconductor substrate and a channel region between a source region and a drain region. The method also includes depositing an interface material on the channel region in the opening, depositing a metal layer, and patterning the metal layer to form a metal crown structure.

In describing one or more of these embodiments, the present disclosure may offer several advantages over prior art devices. In the discussion of the advantages or benefits that follows it should be noted that these benefits and/or results may be present is some embodiments, but are not required. Advantages of some embodiments of the present disclosure include the ability to offer a customer-customizable product. For example, fluidic channel formation, receptor introduction and the like may be performed by a customer. The size, shape, and material of the metal crown structure may be customized by the customer. As a further example of advantages of one or more embodiments described herein, in conventional devices it is typical to require high aspect ratio processing to form a bio-compatible interface (e.g., requiring etching from a front surface of the substrate to a gate structure). Because the present methods provide for processing on a backside of a thinned wafer, the aspect ratio is reduced.

What is claimed is:

1. A biological field-effect transistor (BioFET) device, comprising:
   a substrate comprising a semiconductor layer;
   a transistor comprising a gate structure disposed on a front side of the semiconductor layer and a channel region disposed between source and drain regions that are disposed within the semiconductor layer;
   first and second doped regions comprising dopants of a conductivity type that is different from dopants in the source and drain regions,
   wherein the source region comprises a first vertical inner sidewall in contact with the channel region and a first vertical outer sidewall in contact with the first doped region, and
   wherein the drain region comprises a second vertical inner sidewall in contact with the channel region and a second vertical outer sidewall in contact with the second doped region;
   a multi-layer interconnect (MLI) structure disposed on the front side of the semiconductor layer and comprising an inter-metal dielectric layer and a conductive line;
   a dielectric layer comprising a first portion disposed on a first surface plane and a second portion disposed on a second surface plane different from the first surface plane,
   wherein the first portion of the dielectric layer is in contact with back-side surfaces of the source and drain regions and the first and second doped regions, and
   wherein the second portion of the dielectric layer extends into the semiconductor layer and into the inter-metal dielectric layer and is in contact with the conductive line and a sidewall of the semiconductor layer;
   an interface layer comprising a high-k dielectric layer disposed within an opening of the dielectric layer; and
   a metal crown structure disposed on the dielectric layer and the interface layer, wherein a first portion of the metal crown structure is in contact with a top surface of the dielectric layer, a second portion of the metal crown structure is disposed on a side surface of the dielectric layer, and a third portion of the metal crown structure is disposed on the interface layer.

2. The BioFET device of claim 1, wherein the metal crown structure has a surface area that is about two times greater than a surface area of the interface layer.

3. The BioFET device of claim 1, wherein the metal crown structure is in contact with the dielectric layer.

4. The BioFET device of claim 1, wherein the metal crown structure is aligned over the gate structure.

5. The BioFET device of claim 1, wherein the metal crown structure comprises a metal or an oxide of a metal.

6. The BioFET device of claim 1, wherein the metal crown structure comprises tantalum or ruthenium oxide.

7. The BioFET device of claim 1, further comprising an interconnect layer disposed on the dielectric layer and adjacent to the first portion of the metal crown structure.

8. The BioFET device of claim 1, further comprising a fluidic channel disposed over the metal crown structure.

9. The BioFET device of claim 1, further comprising:
a passivation layer disposed on the dielectric layer; and
a fluidic channel disposed on the passivation layer.

10. The BioFET device of claim 1, further comprising a receptor disposed on the metal crown structure, wherein the receptor is selected from the group consisting of enzymes, antibodies, ligands, receptors, peptides, nucleotides, cells of organs, organisms and pieces of tissue.

11. A biological field-effect transistor (BioFET) device, comprising:
a substrate comprising a semiconductor layer;
a first dielectric layer disposed on a front side of the semiconductor layer;
a conductive line disposed in the first dielectric layer;
a second dielectric layer comprising a silicon oxide layer disposed on a back side of the semiconductor layer, wherein the second dielectric layer extends into the semiconductor layer and into the first dielectric layer and is in contact with the conductive line; and
an array of transistors, wherein each transistor of the array of transistors comprises:
a gate structure disposed on the front side of the semiconductor layer and
a channel region disposed between and in contact with vertical inner sidewalls of source and drain regions that are disposed within the semiconductor layer, wherein the source and drain regions are in contact with a bottom surface of the second dielectric layer;
a first doped region disposed between a first portion of the semiconductor layer and a vertical outer sidewall of the source region;
a second doped region disposed between a second portion of the semiconductor layer and a vertical outer sidewall of the drain region, wherein the first and second doped regions comprise dopants of a conductivity type that is different from dopants in the source and drain regions;
an interface layer comprising a metal oxide layer disposed within an opening of the second dielectric layer, wherein the interface layer is in contact with the source and drain regions; and
a metal crown structure disposed on top and side surfaces of the second dielectric layer and disposed directly on the interface layer, wherein the metal crown structure of a first transistor of the array of transistors comprises a first metal and the metal crown structure of a second transistor of the array of transistors comprises a second metal that is different from the first metal.

12. The BioFET device of claim 11, wherein each of the metal crown structures has a surface area that is about two times greater than a surface area of the interface layer.

13. The BioFET device of claim 11, wherein the metal crown structure of the first transistor comprises a metal and the metal crown structure of the second transistor comprises an oxide of a metal.

14. The BioFET device of claim 11, wherein the metal crown structure of the first transistor comprises tantalum and the metal crown structure of the second transistor comprises ruthenium oxide.

15. The BioFET device of claim 11, further comprising a receptor disposed on each of the metal crown structures, wherein the receptor is selected from the group consisting of enzymes, antibodies, ligands, receptors, peptides, nucleotides, cells of organs, organisms and pieces of tissue.

16. The BioFET device of claim 11, further comprising first and second receptors disposed on the metal crown structures of the first and second transistors,
wherein the first receptor has higher affinity for the metal crown structure of the first transistor than the metal crown structure of the second transistor, and
wherein the second receptor is not selective between the metal crown structures of the first and second transistors.

17. A biological field-effect transistor (BioFET) device, comprising:
a substrate comprising a semiconductor layer;
a multi-layer interconnect (MLI) structure disposed on a front side of the semiconductor layer and comprising an inter-metal dielectric layer and a conductive line;
an oxide layer disposed on a back side of the semiconductor layer, wherein the oxide layer extends into the semiconductor layer and into the inter-metal dielectric layer and is in contact with the conductive line;
a gate structure disposed on the front side of the semiconductor layer;
source and drain regions disposed in the semiconductor layer;
a first doped region disposed between a first portion of the semiconductor layer and the source region;
a second doped region disposed between a second portion of the semiconductor layer and the drain region, wherein the first and second doped regions comprise dopants of a conductivity type that is different from dopants in the source and drain regions;
a channel region disposed in the semiconductor layer, wherein the oxide layer comprises an opening aligned with the channel region,
wherein the source region comprises a first vertical inner sidewall in contact with the channel region and a first vertical outer sidewall in contact with the first doped region, and
wherein the drain region comprises a second vertical inner sidewall in contact with the channel region and a second vertical outer sidewall in contact with the second doped region; and
a conductive layer comprising a composite layer of a ruthenium oxide layer and a tungsten nitride layer disposed on the oxide layer.

18. The BioFET device of claim 17, wherein the conductive layer is disposed on top and side surfaces of the oxide layer.

19. The BioFET device of claim 17, further comprising an interface layer comprising a high-k dielectric layer disposed between the channel region and the conductive layer.

20. The BioFET device of claim 17, further comprising an interface layer, wherein the conductive layer has a surface area that is about two times greater than a surface area of the interface layer.

* * * * *